(12) United States Patent
Nagaraj

(10) Patent No.: US 6,541,952 B2
(45) Date of Patent: Apr. 1, 2003

(54) ON-LINE CANCELLATION OF SAMPLING MISMATCH IN INTERLEAVED SAMPLE-AND-HOLD CIRCUITS

(75) Inventor: Krishnasawamy Nagaraj, Somerville, NJ (US)

(73) Assignee: Texas Instruments Incorporated, Dallas, TX (US)

( * ) Notice: Subject to any disclaimer, the term of this patent is extended or adjusted under 35 U.S.C. 154(b) by 51 days.

(21) Appl. No.: 09/778,700

(22) Filed: Feb. 7, 2001

(65) Prior Publication Data

US 2002/0105339 A1 Aug. 8, 2002

(51) Int. Cl.[7] .............................................. G01R 13/34
(52) U.S. Cl. .................. 324/76.42; 324/76.38
(58) Field of Search ............................ 324/601, 76.35, 324/76.41, 119, 76.18, 76.38, 76.15, 76.42, 76.58

(56) References Cited

U.S. PATENT DOCUMENTS

| | | | | |
|---|---|---|---|---|
| 4,364,027 A | * | 12/1982 | Murooka ................. 324/121 R |
| 4,903,022 A | | 2/1990 | Hester et al. ................ 341/110 |
| 4,943,807 A | * | 7/1990 | Early et al. .................. 341/120 |
| 5,008,563 A | | 4/1991 | Kenney et al. ............. 307/269 |
| 5,027,116 A | * | 6/1991 | Armstrong et al. ............ 330/9 |
| 5,065,351 A | * | 11/1991 | Johnston et al. ............. 702/107 |
| 5,266,951 A | * | 11/1993 | Kuegler et al. ............. 341/118 |
| 5,287,063 A | * | 2/1994 | Izawa ......................... 324/130 |
| 5,471,162 A | * | 11/1995 | McEwan .................... 327/251 |
| 5,909,026 A | * | 6/1999 | Zhou et al. ............. 250/208.1 |
| 6,020,769 A | | 2/2000 | Vallancourt ................... 327/94 |
| 6,081,214 A | * | 6/2000 | Morisson et al. ........... 341/118 |
| 6,107,803 A | * | 8/2000 | Wang ......................... 324/453 |
| 6,483,448 B2 | * | 11/2002 | Martin et al. ................ 341/123 |

* cited by examiner

Primary Examiner—Christine Oda
Assistant Examiner—John Teresinski
(74) Attorney, Agent, or Firm—W. Daniel Swayze, Jr.; W. James Brady; Frederick J. Telecky, Jr.

(57) ABSTRACT

The present invention relates to a high speed sample and hold circuit having a plurality of sample and hold subcircuits coupled in parallel between an input and an output. The circuit also having a calibration sample and hold subcircuit coupled to the plurality of sample and hold subcircuits. The calibration circuit is operable to modify a timing for one or more of the plurality of sample and hold subcircuits to thereby reduce sampling mismatch between the plurality of sample and hold subcircuits. The present invention also having a method of reducing timing mismatch in a high speed, parallel coupled sample and hold circuit.

18 Claims, 10 Drawing Sheets

ON-LINE CANCELLATION OF SAMPLING MISMATCH IN INTERLEAVED SAMPLE-AND-HOLD CIRCUITS

TECHNICAL FIELD

The present invention relates generally to electrical circuits, and more particularly to a system and method for reducing sampling mismatch in sample and hold circuits.

BACKGROUND OF THE INVENTION

Analog to digital converters (ADCS) are important analog circuit devices which take an analog input signal and generate one or more digital signals which are representative of the analog input. ADCs are used in many applications such as communications applications in which the components receive a voice input (an analog input) and transform the voice date into a digital format for internal processing. Exemplary applications using such ADCs are illustrated in prior art FIGS. 1 and 2, respectively. For example, in prior art FIG. 1, an exemplary base transceiver station (BTS) 10 is illustrated in which an RF analog input signal 12 is received, amplified and converted into a digital signal 14 before being processed in a baseband section 16 and network interface section 18. Similarly, prior art FIG. 2 illustrates a schematic diagram of an automobile multimedia system 20 in which various analog signals such as radio signals 22 and sensor signals 24 are transformed into digital signals for subsequent processing. Further, many other system applications exist, including, but not limited to, data communication receivers or hard disk drive (HDD) read channel applications such as the system 26 of prior art FIG. 3.

One of the most challenging portions of an ADC is the sample and hold (S/H) circuit at the front end thereof. As the speed of ADCs continues to grow, the design of the S/H circuit becomes more challenging, and various solutions have been proposed to improve the speed of such S/H circuits. One prior art circuit solution for improving the speed of a S/H circuit is illustrated in prior art FIG. 4 and designated at reference numeral 30. The S/H circuit 30 consists of four S/H subcircuits 32a–32d coupled together in parallel. Each of the S/H subcircuits 32a–32d operates individually as a S/H circuit, wherein the input $V_{IN}$ is passed to the output $V_{OUT}$ during a "sampling mode" and the state of the input is maintained on the output in the "hold mode", respectively.

The speed of the S/H circuit 30 of FIG. 4 is increased by using several individual S/H subcircuits 32a–32d interleaved in time. An exemplary sample timing diagram for the S/H circuit 30 is illustrated in prior art FIG. 5. Note that with multiple S/H subcircuits interleaved in time, each subcircuit transitions through one sample and hold cycle during four clock (CLK) cycles, whereas if a similar speed were desired with only a single S/H subcircuit, the sample and hold functions each would have to be completed within a one-half (½) clock cycle. Therefore in the above parallel interleaved configuration, the overall speed is increased without requiring higher performance from the individual S/H subcircuit elements.

Referring again to prior art FIG. 4, although the pass gates at the output of the overall S/H circuit 30 might seem like a possible speed limitation, usually such S/H circuits are followed by one or more output buffers. In such a case, the RC filter of the pass gate and the input capacitance of the output buffer is usually fairly small compared with the speed gained through parallelism.

One problem with the technique provided by the circuit 30 of prior art FIG. 4 is that if the S/H subcircuits 32a–32d are not perfectly matched, then errors can occur. The three chief types of mismatch associated with the interleaved S/H circuit 30 are offset mismatch, gain mismatch and sampling mismatch (which is sometimes referred to as timing mismatch). A brief discussion of the operation of an individual conventional S/H subcircuit is provided below in order to appreciate the impact that sampling mismatch has on the performance of the S/H circuits 30.

An exemplary prior art sample and hold subcircuit is illustrated in prior art FIG. 6, and designated at reference numeral 40. Circuit 40 is an exemplary detailed circuit of the structure 32a in FIG. 4. Transistor M1 operates as a sampling switch, and $C_{HOLD}$ acts as a sampling capacitor. In the sampling mode, a sampling signal "S" is asserted, thereby closing a switch 42, which activates M1 (turns M1 on). With M1 on, $V_{IN}$ is passed to the output $V_{OUT}$.

A significant time point relating to sampling mismatch in S/H circuits deals with the instant when the sampling switch M1 is deactivated, or turned off. Any deviation of the deactivation of M1 from perfect CLK/N time periods will cause a sampling mismatch between the various subcircuits (e.g., 32a–32d) and result in distortion at the output $V_{OUT}$ (e.g., resulting in undesired "tones" at the output at $f_{in} \pm f_s/N$, wherein $f_{in}$ is the frequency of $V_{IN}$, $f_s$ is the sampling frequency, and N represents the number of interleaved channels). To deactivate M1, the sample signal "S" goes low (opening switch 42) and a hold signal "H" is asserted, which causes a switch 43 to close. This instance pulls the gate of M1 down to ground, thus turning M1 off. Each S/H subcircuit has its own hold signal "H"; consequently, a primary source of the sampling mismatch relates to mismatches in the switch M1 driven by "H" and the arrival of the hold signal "H" at each subcircuit switch, respectively. In addition, even if no sampling mismatch occurs between the hold signals ("H") of the various subcircuits 32a–32d, a sizing mismatch of switch 43 or M1 between the various subcircuits may exist which may contribute disadvantageously to sampling mismatch.

There is a need in the art for a circuit and method for increasing the speed in sample and hold circuits in which timing mismatch is reduced substantially.

SUMMARY OF THE INVENTION

According to the present invention, a system and method of reducing sampling mismatch in high speed S/H circuits is disclosed.

According to the present invention, sampling mismatch, for example, related to the sampling switch in various S/H subcircuits, is reduced by calibrating the subcircuits, for example, by modifying a delay associated with the hold signal of the subcircuits so as to minimize sampling mismatch between S/H subcircuits. In the above manner, the sampling mismatch between the various S/H subcircuits associated with the arrival of the hold signal at its switch in each subcircuit is reduced substantially or eliminated altogether.

The present invention is directed to a system and method for reducing sampling mismatch in high speed S/H circuits. In S/H circuits employing a plurality of time interleaved S/H subcircuits, sampling mismatch is reduced via calibration by modification of the hold signal to thereby establish a predetermined timing relationship between each of the S/H subcircuits. Such calibration is performed "on line", thereby allowing for calibration of the S/H circuit without disconnecting the circuit chip from the signal path associated therewith in accordance with conventional "off line" calibration techniques.

According to one exemplary aspect of the present invention, calibration among a plurality of time-interleaved S/H subcircuits is accomplished by calibrating each S/H subcircuit separately with a pre-calibrated S/H subcircuit on-chip which serves as a calibration standard. Each calibration with the pre-calibrated S/H subcircuit provides an output result which is analyzed to identify sampling mismatch between the S/H subcircuit under test and the calibration standard. Such analysis is then used to modify the hold signal associated with the S/H subcircuit under test to minimize the timing mismatch.

Therefore the present invention provides for an "on line" calibration system and methodology as opposed to an "off line" type calibration. In order to fully appreciate several of the advantageous features of the present invention, a brief discussion follows below on how an "off line" calibration system operates. A detailed description of the "on line" calibration system and method of the present invention will then follow thereafter.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed and the present invention is intended to include all such embodiments and their equivalents. Other objects, advantages and novel features of the invention will become apparent from the following detailed description of the invention when considered in conjunction with the drawings.

DETAILED DESCRIPTION OF THE INVENTION

The present invention will now be described with respect to the accompanying drawings in which like numbered elements represent like parts.

The present invention is directed to a system and method for reducing sampling mismatch in high speed S/H circuits. In S/H circuits employing a plurality of time interleaved S/H subcircuits, sampling mismatch is reduced via calibration by modification of the hold signal to thereby establish a predetermined timing relationship between each of the S/H subcircuits. Such calibration is performed "on line", thereby allowing for calibration of the S/H circuit without disconnecting the circuit chip from the signal path associated therewith in accordance with conventional "off line" calibration techniques.

According to one exemplary aspect of the present invention, calibration among a plurality of time-interleaved S/H subcircuits is accomplished by calibrating each S/H subcircuit separately with a pre-calibrated S/H subcircuit on-chip which serves as a calibration standard. Each calibration with the pre-calibrated S/H subcircuit provides an output result which is analyzed to identify sampling mismatch between the S/H subcircuit under test and the calibration standard. Such analysis is then used to modify the hold signal associated with the S/H subcircuit under test to minimize the timing mismatch.

Therefore the present invention provides for an "on line" calibration system and methodology as opposed to an "off line" type calibration. In order to fully appreciate several of the advantageous features of the present invention, a brief discussion follows below on how an "off line" calibration system operates. A detailed description of the "on line" calibration system and method of the present invention will then follow thereafter.

Figure 1:
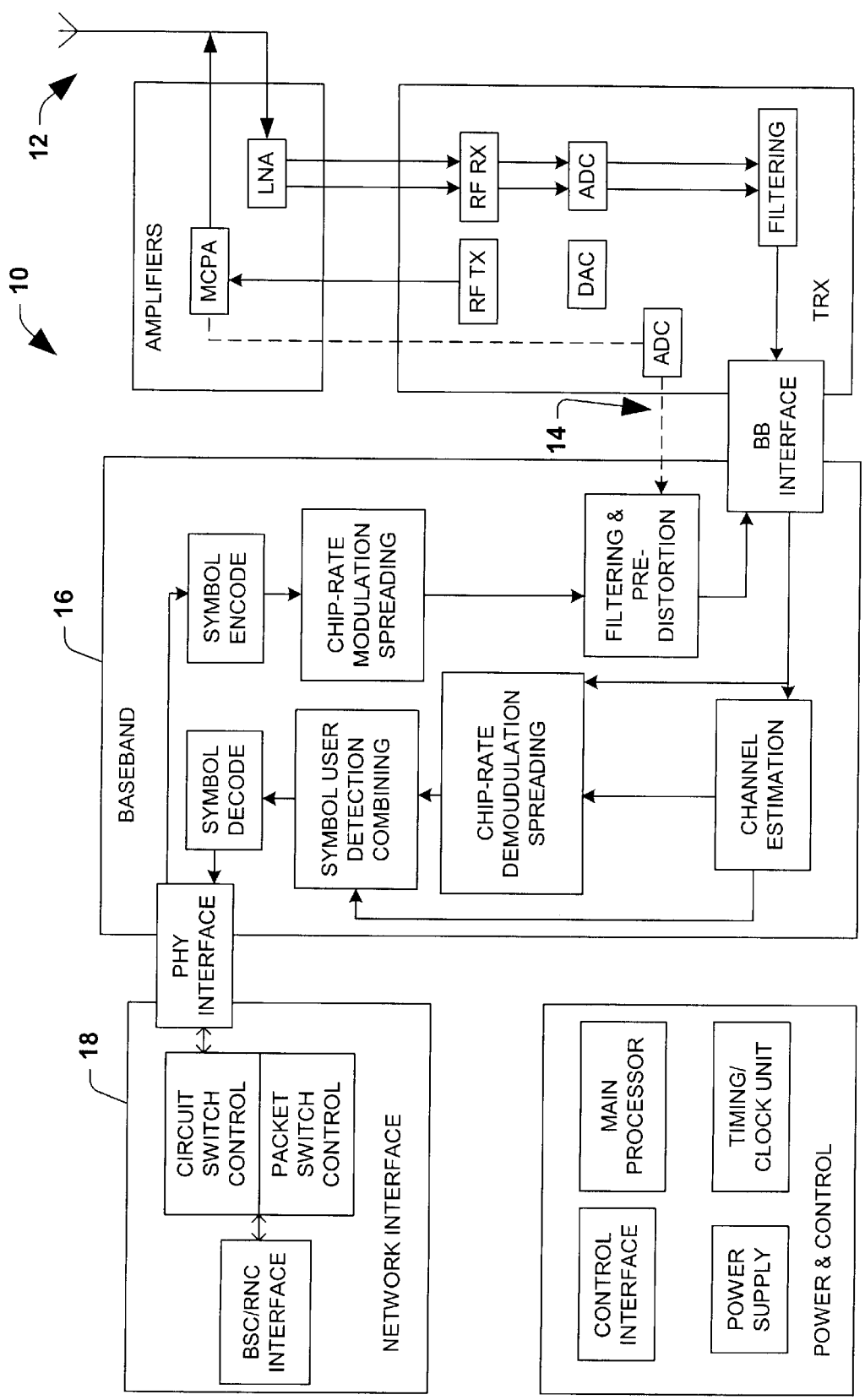
FIG. 1 is a block system level diagram illustrating a prior art base transceiver station utilizing a plurality of ADCs.
Figure 2:
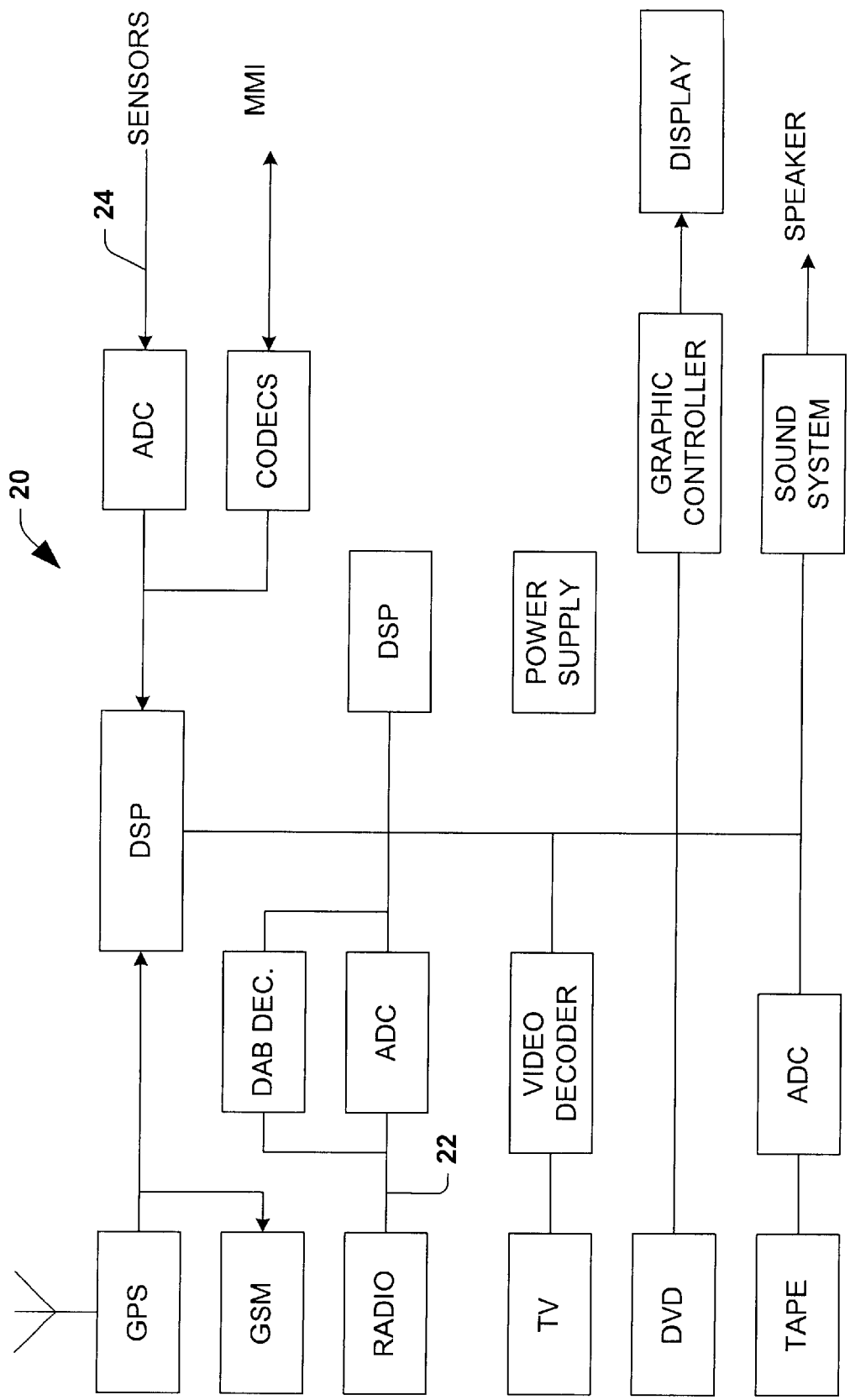
FIG. 2 is a block system level diagram illustrating a prior art multimedia controller for an automobile employing a plurality of ADCs.
Figure 3:
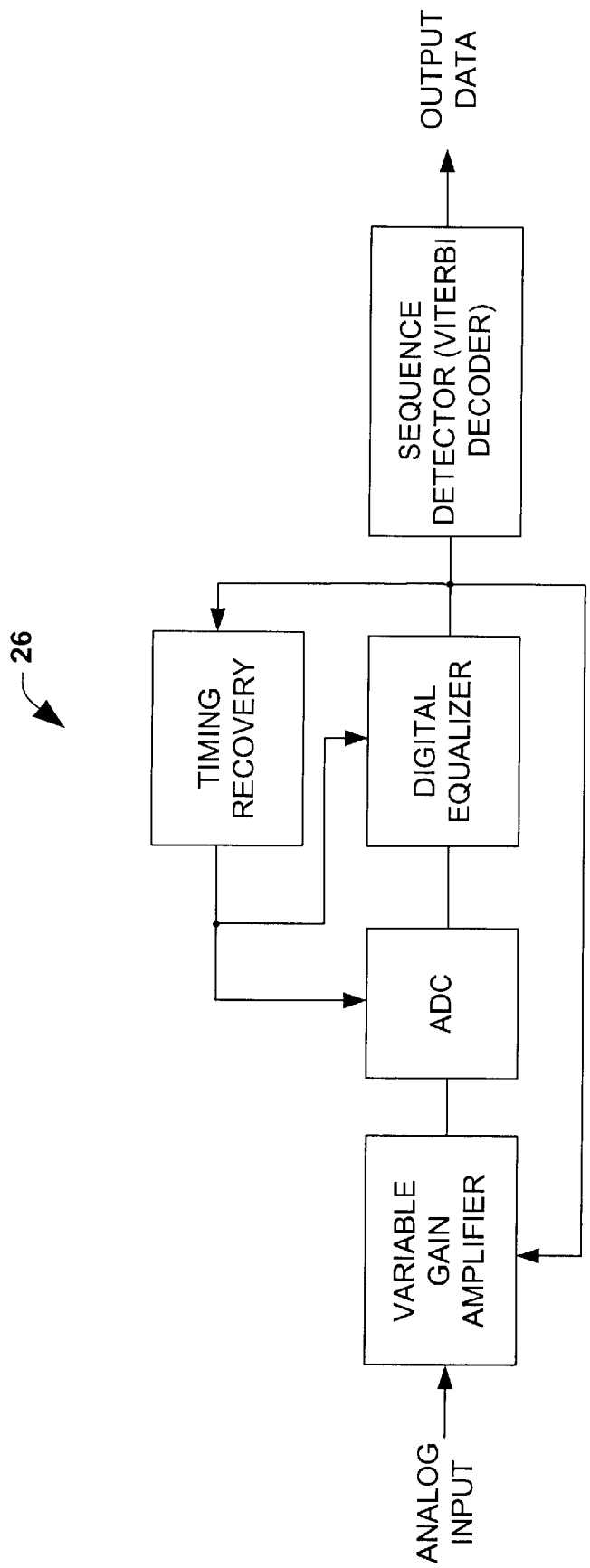
FIG. 3 is a block system level diagram illustrating a prior art data communication receiver or a disk drive read channel employing an ADC.
Figure 4:
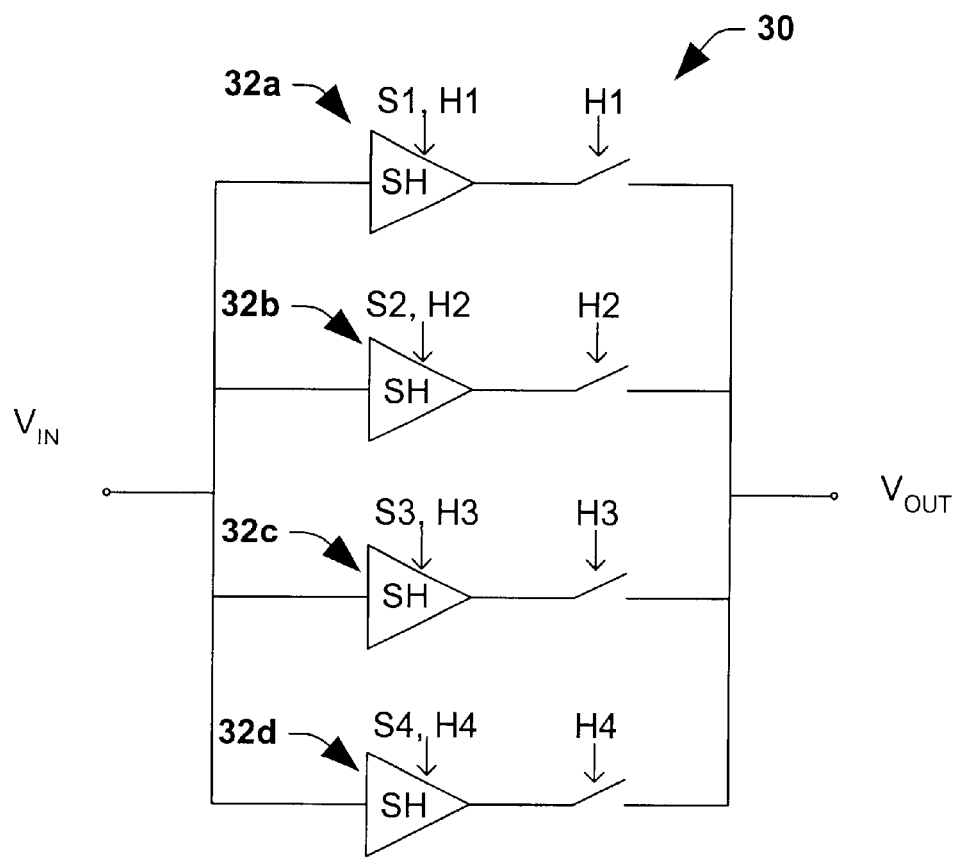
FIG. 4 is a simplified schematic diagram illustrating a prior art high speed sample and hold (S/H) circuit having four S/H subcircuits coupled together in parallel, time-interleaved fashion.
Figure 5:
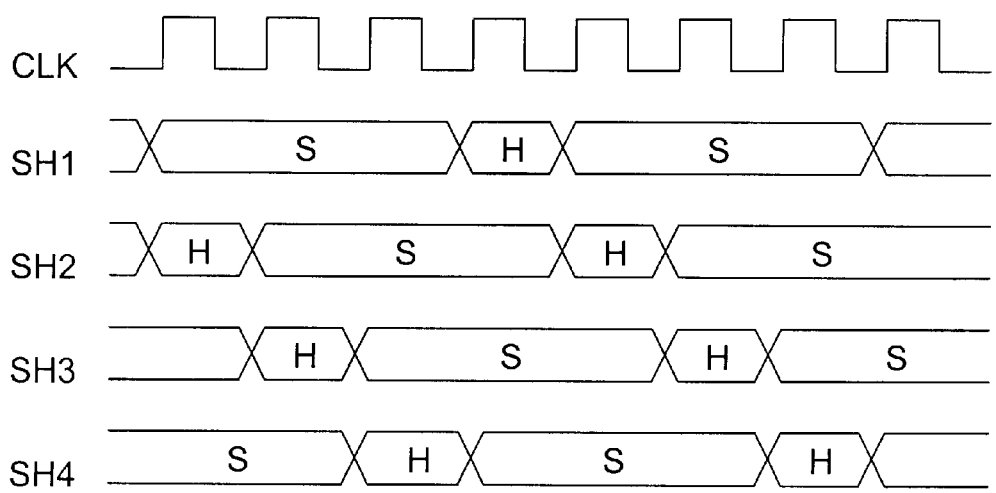
FIG. 5 is a timing diagram illustrating an exemplary timing operation for the four S/H subcircuits of prior art FIG. 4.
Figure 6:
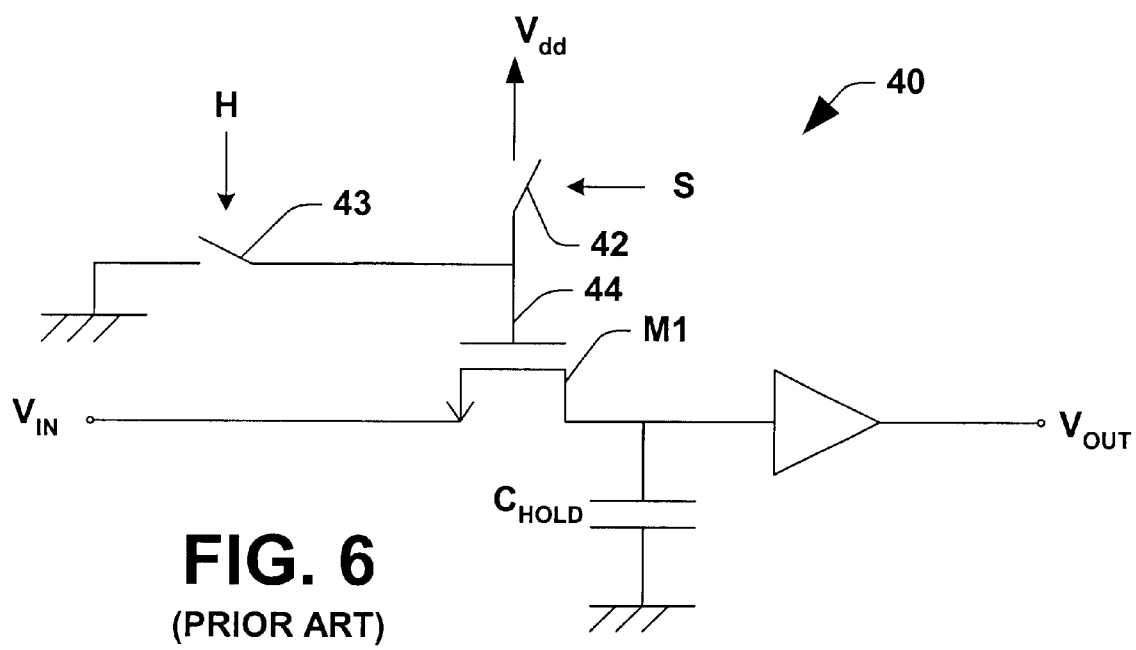
FIG. 6 is a shematic diagram illustrating an exemplary prior art S/H subcircuit used in prior art FIG. 4 used to help illustrate the problem associated with sampling mismatch in prior art high speed S/H circuits.
Figure 7:
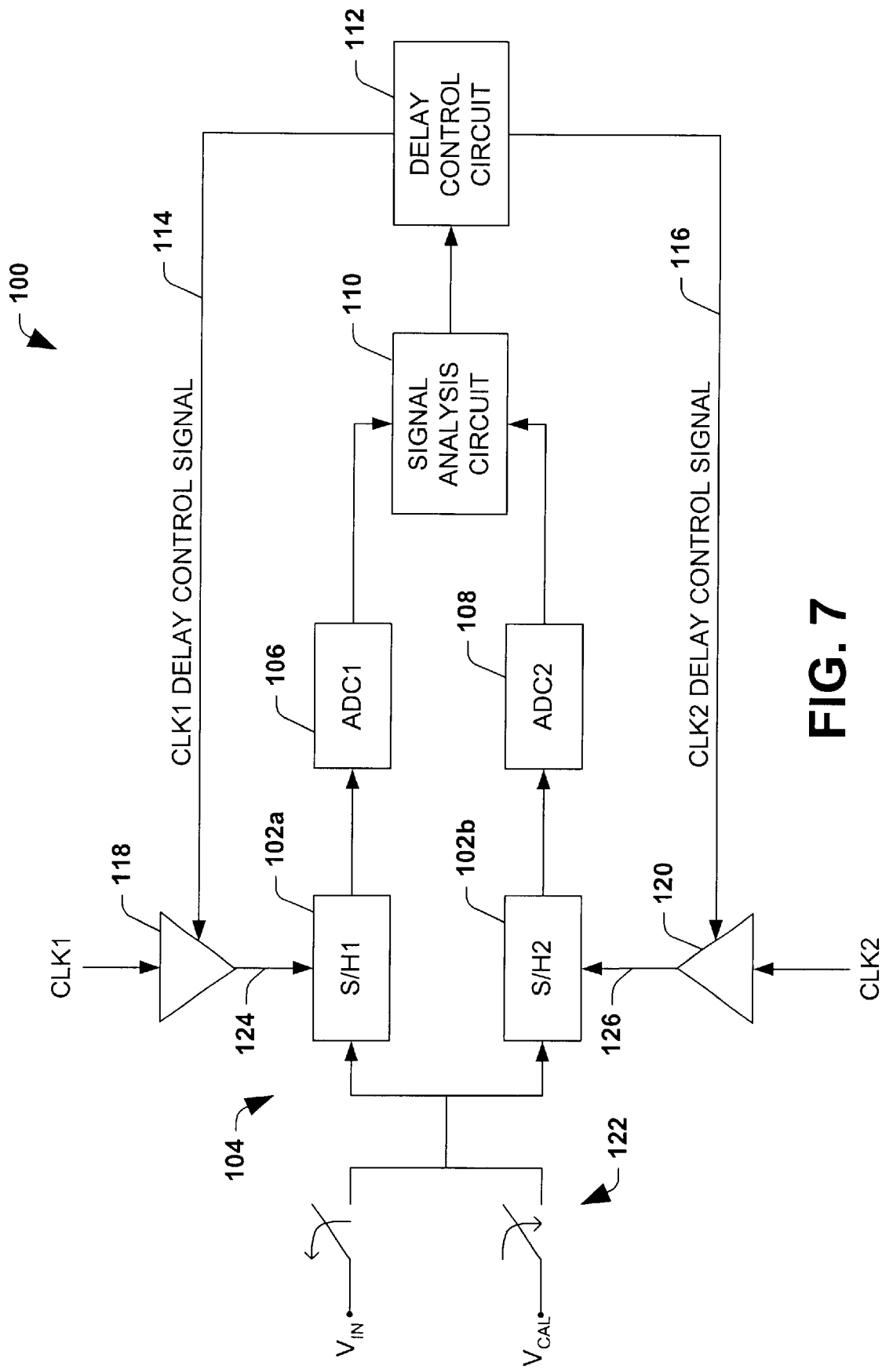
FIG. 7 is a combined block and schematic diagram illustrating an off-line calibration system for reducing sampling mismatch in parallel, time-interleaved sample and hold circuits.

Turning now to the figures, FIG. 7 is a schematic diagram illustrating one exemplary type of "off line" system or circuit for identifying and reducing sampling mismatch in a high speed, parallel coupled S/H circuit, and is designated at reference numeral 100. The S/H circuit 100 includes a plurality of S/H subcircuits 102a and 102b, which are coupled between an input portion 104 (which includes an analog input terminal $V_{IN}$) and analog-to-digital converters (ADC1 106 and ADC2 108), respectively. Each ADC is coupled to a signal analysis circuit 110, for example, a comparator, which feeds a delay control circuit 112. Based on the input from the signal analysis circuit 110, the delay control circuit 112 provides delay control signals 114 and 116 to programmable delay elements 118 and 120, respectively, which operates to modify a delay associated with the clock signals CLK1 and CLK2.

In operation, the integrated circuit chip employing the system 100 of FIG. 7 receives a suitable calibration signal ($V_{CAL}$) to the input portion 104 via a switching network 122. Based on the delay associated with the programmable delay elements 118 and 120, modified clock signals 124 and 126 are employed to set the timing for the S/H subcircuits 102a and 102b, respectively. The variation in the timing of the clock signals is then apparent in the outputs of the ADCs 106 and 108. By comparing such outputs via the signal analysis circuit 110, sampling mismatch associated with the modified clock signals 124 and 126 may be ascertained. The signal analysis circuit 110 then outputs a signal associated with such sampling mismatch to the delay control circuit which uses one or more of the delay control signals 114 and 116 to alter the delays of the programmable delay elements 118 and 120. The process continues until the sampling mismatch associated with the S/H subcircuits 102a and 102b are within an acceptable level.

The above solution works modestly well in calibrating the S/H subcircuits so as to minimize sampling mismatch therebetween. Unfortunately, the S/H subcircuits 102a and 102b in FIG. 7 are disconnected from the signal path during such calibration, thus making the calibration occur "off line." The inventors of the present invention appreciated that by providing a solution in which the S/H subcircuits do not have to be disconnected from the signal path, such calibration may occur "on line" and thus provide minimized sampling mismatch without adversely impacting system performance.

Figure 8:
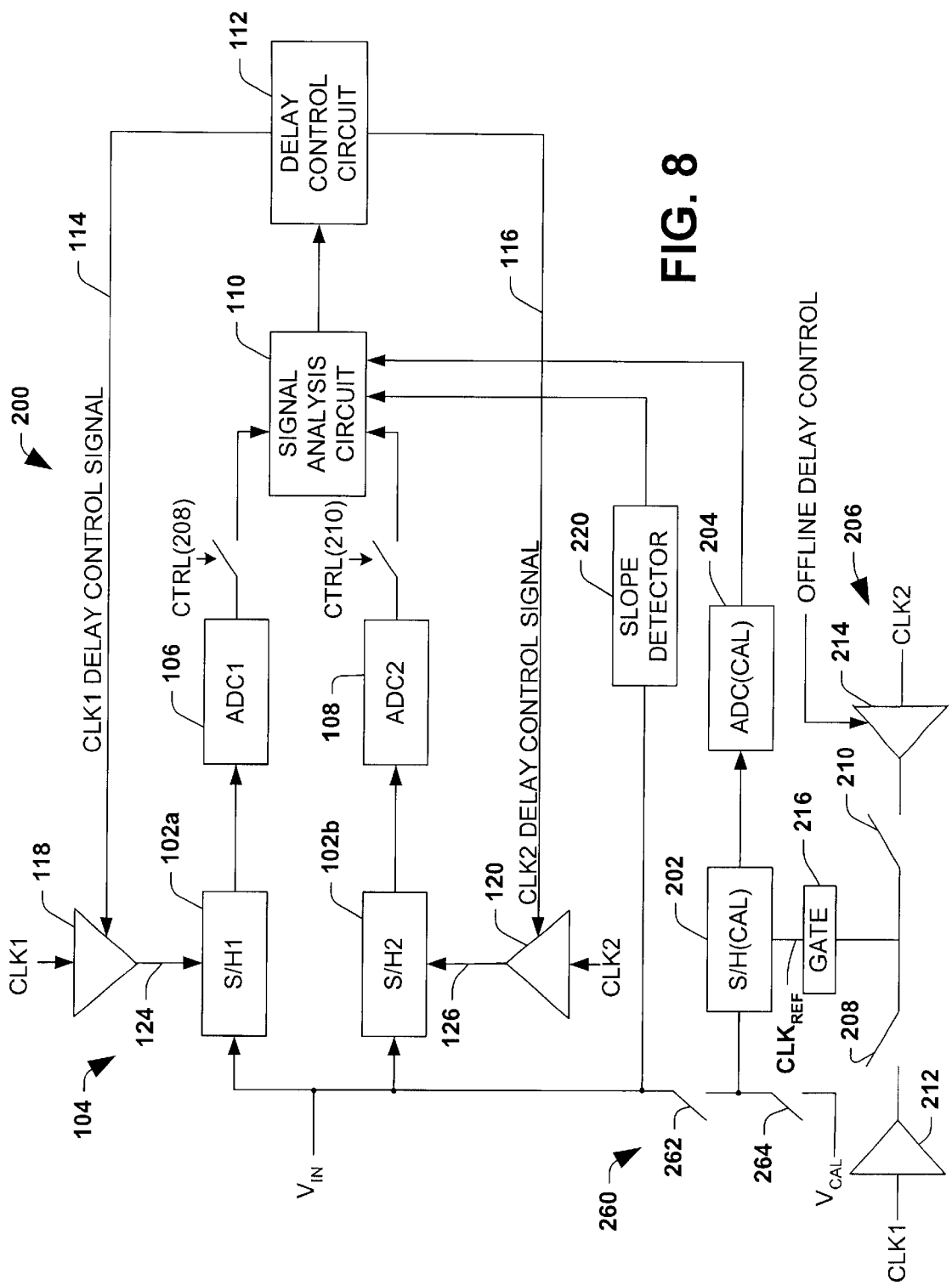
FIG. 8 is a combined block and schematic diagram illustrating an on-line calibration system for reducing sampling mismatch in parallel, time-interleaved sample and hold circuit according to the present invention.

Turning now to FIG. 8, an on-line calibration circuit for calibrating a plurality of S/H subcircuits together is illustrated and designated at reference numeral 200. The system 200 is similar in some respects to the system 100 of FIG. 7, however, system 200 differs in several ways. Initially, the system 200 of the present invention includes a calibrated S/H subcircuit 202 (S/H(CAL)) and an ADC 204 (ADC (CAL)) which feed the signal analysis circuit 110. The calibrated S/H subcircuit 202 is fed by a switching arrangement 206 in which CLK1 or CLK2 is provided thereto. For example, when the S/H1 subcircuit 102a is to be calibrated, CLK1 is fed to the calibration S/H subcircuit 202 by closing a switch 208 and opening another switch 210; likewise opening the switch 208 and closing the switch 210 allows for CLK2 to be fed to the calibration S/H circuit 202 when S/H2 circuit 102b is to be calibrated. Note that although the system 200 of FIG. 8 illustrates only two time interleaved S/H circuits 102a and 102b, the present invention contemplates use of a plurality of S/H circuits coupled in parallel generally (e.g., four or more interleaved channels) and such variations are contemplated as falling within the scope of the present invention.

Figure 9:
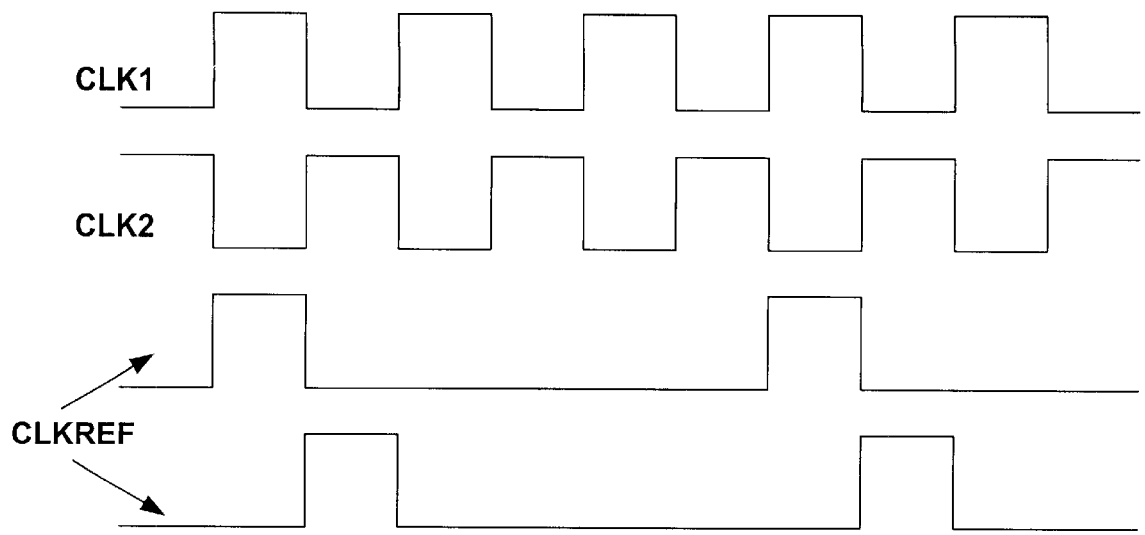
FIG. 9 is a series of timing diagrams illustrating a gating function by which clock signals having one frequency may be divided down to a second, lower frequency according to the present invention.

The calibration S/H circuit 202 is initially calibrated offline and its delays are adjusted via delay elements 212 and 214, respectively, to provide a predetermined timing for the clock signals CLK1 and CLK2, respectively. In addition, an optional gate circuit 216 may be interposed between the switching arrangement 206 and the calibration S/H subcircuit 202, to divide down the timing signal $CLK_{REF}$ (e.g., either CLK1 or CLK2 based on the states of the switches 208 and 210) if it is desired to make the calibration S/H subcircuit 202 and its ADC 204 operate at a lower sampling rate. For example, as illustrated in FIG. 9, since the sampling clock for the calibration S/H subcircuit 202 may be either CLK1 or CLK2, the gate circuit 216 may be used to slow down the sampling clock as shown (e.g., divide by 4). Of course, if the gate circuit 216 is not present, then $CLK_{REF}$ is either CLK1 or CLK2 depending on which S/H subcircuit is being calibrated.

Returning to FIG. 8, the system 200 further includes a slope detector circuit 220 coupled between the system input and the signal analysis circuit 110. Since signal distortion at the signal analysis circuit 110 may be due to mismatches other than sampling mismatch (e.g., distortion may be due to gain mismatch and/or offset mismatch), the slope detector circuit 220 operates to distill sampling mismatch from gain and/or offset mismatch in order to generate calibration compensation that focuses primarily on the sampling mismatch (gain mismatch and offset mismatch issues are often addressed separately using other type techniques).

Figure 10:
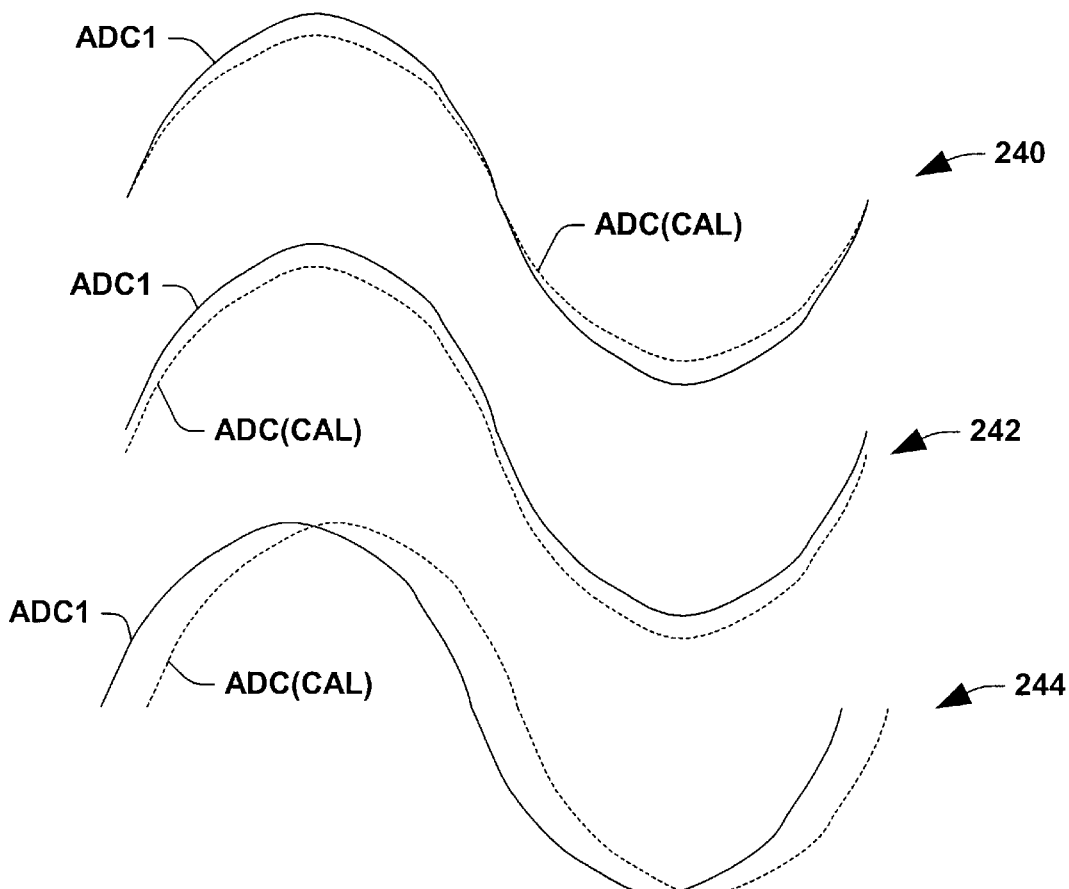
FIG. 10 is a series of timing diagrams illustrating various types of mismatch, namely, gain mismatch, offset mismatch and sampling mismatch, in order to illustrate how sampling mismatch is distilled from other forms of mismatch according to the present invention.

The manner in which the slope detector circuit 220 operates to distill sampling mismatch from other forms of mismatch may be further appreciated in FIG. 10, which illustrates three examples of sample data from ADC1 106 and ADC(CAL) 204. In a first example 240, a gain mismatch is observed in which the peak-to-peak signal amplitude associated with ADC1 106 is greater than that of ADC(CAL) 204. In a second example 242, an offset mismatch is observed, wherein the peak-to-peak signal amplitudes are approximately the same, but offset from one another. Lastly, in a third example 244, a sampling mismatch is observed, wherein one set of sampling data is out of phase with the other. Note that in the case of sampling mismatch, a unique condition results: when the signal slope is positive, the output of ADC(CAL) 204 is always less than that of ADC1 106, and when the signal slope is negative, the output of ADC(CAL) 204 is always greater than ADC1 106. This information is then used to generate a unique error signal, for example, as follows:

$$e_{phase} = \text{sign}[\text{slope}] \times [\text{output of } ADC1 - \text{output of } ADC(CAL)]$$

By accumulating this error over a substantial time interval, errors due to gain mismatch and offset mismatch tend to cancel and thus the sampling mismatch information is distilled therefrom. Thus $e_{phase}$ represents an amount of error due primarily to sampling mismatch and the slope detector circuit 220 may be used to generate such a signal. Using such data, the signal analysis circuit 110 may provide a more accurate analysis.

Figure 11:
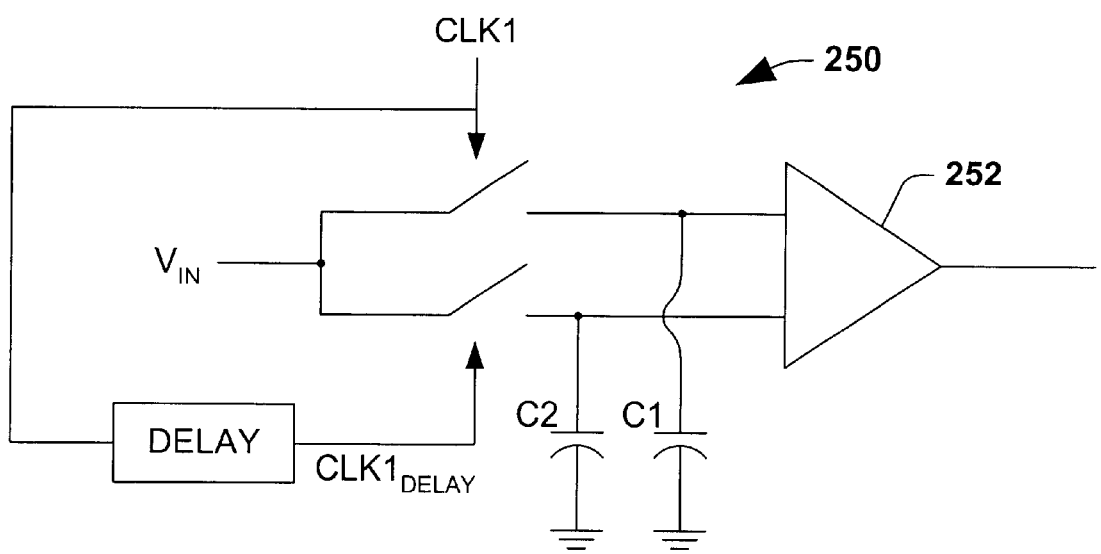
FIG. 11 is a schematic diagram illustrating an exemplary slope detection circuit according to the present invention.

Various types of slope detector circuits may be utilized and are contemplated as falling within the scope of the present invention. For example, in FIG. 11 a slope detector circuit is illustrated and designated at reference numeral 250. The analog input signal $V_{IN}$ is sampled at two separate time intervals using a clock signal (e.g., CLK1) and a delayed clock signal ($CLK1_{DELAY}$), thereby sampling the input signal at two relatively close time intervals across capacitors C1 and C2, respectively, and input to a comparator circuit 252. When $V_{C1}$ is greater than $V_{C2}$, the comparator 252 outputs a first state (e.g., goes high), thereby signaling a positive slope. Conversely, when $V_{C2}$ is greater than $V_{C1}$, the comparator 252 outputs a second state (e.g., goes low), thereby signaling a negative slope. Other type slope detection circuits, however, may alternatively be used and such alternatives are contemplated as falling within the scope of the present invention. The slope detector circuit 220 is thus operable to generate a digital signal which is indicative of the slope for use in generating an ephase error signal, for example, in the signal analysis circuit 110.

Returning now to FIG. 8, the on-line calibration system 200 operates in the following exemplary manner. Initially, the calibration S/H subcircuit 202 is calibrated offline using a switching arrangement 260. For example, one switch 262 is opened which disconnects the analog input ($V_{IN}$) from the calibration S/H subcircuit 202, and another switch 264 is closed which couples a known calibration input signal $V_{CAL}$ thereto. The other switching arrangement 206 is then used to successively couple CLK1 and CLK2 to the calibration S/H subcircuit 202 and analyze its output directly or the output of the ADC(CAL) 204. Using such analysis, the delays associated with delay elements 212 and 214 are configured, respectively, for subsequent calibration of the S/H subcircuits (e.g., 102a and 102b) against the calibration S/H subcircuit 202.

After the initial calibration, the switch 264 opens and the switch 262 closes, thereby disconnecting $V_{CAL}$ from the calibration S/H subcircuit 202 and coupling the analog input $V_{IN}$ thereto. An on-line calibration phase may then begin between the calibration S/H subcircuit 202 and each of the plurality of S/H subcircuits (e.g., 102a and 102b). Note that although FIG. 8 illustrates only two S/H subcircuits which are time-interleaved, a substantially greater number of such S/H subcircuits may be employed and are contemplated as falling within the scope of the present invention. For example, the on-line calibration of S/H1 subcircuit 102a is performed as follows. CLK1 is coupled to the calibration S/H subcircuit 202 through the delay element 212 and the closed switch 208, while the switch 210 is open, thereby making a delayed CLK1 the $CLK_{REF}$ signal that dictates the timing of the calibration S/H subcircuit 202. Thus the analog input signal $V_{IN}$ is sampled via the calibration S/H subcircuit 202 as dictated by $CLK_{REF}$. In addition, the S/H1 subcircuit 102a also samples the input signal $V_{IN}$ using a delayed version 124 of CLK1 as dictated by the delay element 118.

The sampled data, the outputs of ADC1 106 and ADC (CAL) 204, are then analyzed or otherwise compared at the signal analysis circuit 110. Based on such analysis, the signal analysis circuit 110 generates a CLK1 delay control signal 114 via the delay control circuit 112 which adjusts an amount of delay associated with CLK1 via the programmable delay element 118, so as to reduce sampling mismatch between S/H1 subcircuit 102a and the calibration S/H subcircuit 202. In addition, the slope detector 220 also receives the input signal $V_{IN}$ and generates slope information to the signal analysis circuit 110. The signal analysis circuit 110 then uses the slope information along with the data from the ADCs 106 and 204 to generate an error signal (e.g., $e_{phase}$), so that the CLK1 delay control signal 114 operates to compensate primarily for sampling mismatch as opposed to other signal distortion factors.

Once the S/H1 subcircuit 102a is calibrated, the S/H2 subcircuit 102b is calibrated in conjunction with the calibration S/H subcircuit 202 in a manner similar to that described above. That is, the outputs of ADC2 108 and ADC(CAL) 204 are compared along with the slope indication signal taken into account from the slope detector circuit 220 at the signal analysis circuit 110 to generate an error phase signal, which may be used as a CLK2 delay control signal 116 or generate such a signal. The delay control signal 116 then operates to modify a delay associated with CLK2 (signal 126) via the programmable delay element 120. By calibrating S/H1 subcircuits 102a and 102b each with respect to the calibration S/H subcircuit 202, the resulting timing signals 124 and 126 are configured so as to minimize the sampling mismatch therebetween. Furthermore, in doing so, such calibration occurs on-line which allows for calibration to subsequently occur without having to go "offline." Therefore the present invention allows for an initial offline calibration to occur for the initial calibration S/H subcircuit configuration with all subsequent calibration advantageously occurring online.

Figures 12, 13:
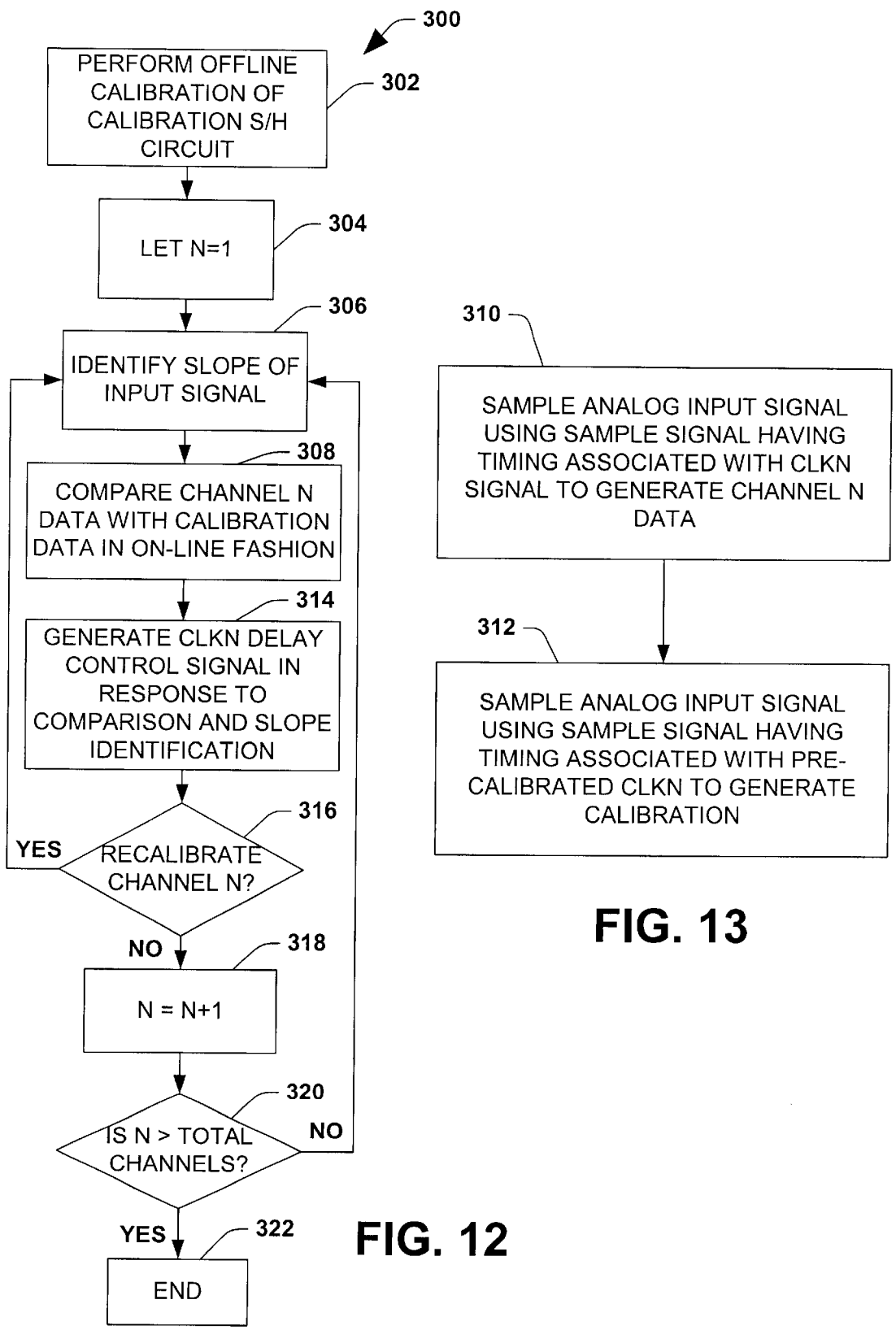
FIG. 12 is a flow chart diagram illustrating a method of reducing sampling mismatch in parallel, time-interleaved sample and hold circuits according to the present invention.
FIG. 13 is a flow chart diagram illustrating a method of comparing data from one channel of a parallel, time-interleaved sample and hold circuit with calibration data according to the present invention.

According to another aspect of the present invention, a method of performing on-line calibration for time-interleaved sample and hold subcircuits is disclosed, as illustrated in FIG. 12 and designated at reference numeral 300. While for purposes of simplicity of explanation, the methodology of FIG. 12 is shown and described as a series of steps, it is to be understood and appreciated that the present invention is not limited to the order of steps, as some steps may, in accordance with the present invention, occur in different orders and/or concurrently with other steps from that shown and described herein.

The method 300 begins at step 302, wherein an offline calibration of the calibration S/H subcircuit is performed. For example, as illustrated in FIG. 8, a plurality of sampling signals (e.g., CLK1, CLK2) are modified using delay circuits (e.g., circuits 212 and 214). In the above manner, a $CLK_{REF}$ signal is established as a standard by which each of the parallel, time-interleaved S/H subcircuits can be calibrated. Once the offline calibration of the calibration S/H subcircuit is complete, a channel initialization occurs at step 304.

The slope of the analog input signal ($V_{IN}$) is identified at step 306, for example, by inputting $V_{IN}$ to a slope detection circuit. Alternatively, the slope of the signal may be identified using various forms of signal processing, as may be desired, and any such form of identification is contemplated as falling within the scope of the present invention. The method 300 then continues at step 308, wherein the data from the Nth channel (e.g., channel 1 when N=1) is compared with the calibration data in an on-line fashion. For example, as illustrated in FIG. 8, with switch 262 closed and switch 264 open, the analog input signal $V_{IN}$ is input to the calibration subcircuit 202 and sampled by ADC(CAL) 204 using the appropriate $CLK_{REF}$ signal. Since channel 1 is being calibrated at this time, $CLK_{REF}$ is a calibrated version of CLK1 using, for example, closed switch 208 and open switch 210. The VIN signal is also input to the S/H1 subcircuit 102a and ADC1 106 with CTRL(208) closing the appropriate switch (and CTRL(210)) maintaining its switch open) so that the signal analysis circuit 110 compares the data from ADC1 106 and ADC(CAL) 204, respectively.

According to the above exemplary aspect of the present invention, the signal analysis comparison of step 308 is performed using digitized data from ADC1 106 and ADC (CAL) 204. Alternatively, however, the comparison can be performed using the data directly from the S/H subcircuits (e.g., S/H1 subcircuit 102a and subcircuit 202), as may be desired. Various forms of signal analysis and/or comparison may be performed to ascertain a degree of sampling mismatch and any such comparison or analysis is contemplated as falling within the scope of the present invention.

For example, turning to FIG. 13, the comparison step 308 may be accomplished by sampling the analog input signal (e.g., $V_{IN}$) using the sample signal which has a timing associated with the Nth clock signal (e.g., signal 124 of FIG. 8) to generate Nth channel data at step 310. Further, the analog input data VIN may be sampled using a sample signal having a timing associated with a pre-calibrated clock signal (e.g., $CLK_{REF}$) to generate calibration data at step 312 which may then be compared and/or analyzed using, for example, the signal analysis circuit 110 of FIG. 8.

The method 300 then further continues at step 310, wherein a delay control signal is generated for the Nth channel in response to the comparison of step 308 and the slope identified in step 306. For example, as illustrated in FIG. 8, the signal analysis circuit 110 is operable to generate an $e_{phase}$ signal by which the delay control circuit 112 generates a clock delay control signal (e.g., CLK1 delay control signal 114) to modify a delay associated with a delay element (e.g., delay element 118) to vary a timing associated with the clock.

The method 300 then continues at step 316 by determining whether a recalibration is necessary. For example, such a determination may be made by comparing ephase to a predetermined threshold and one ephase is less than the threshold, further calibration is discontinued. Alternatively, however, other analyses may be employed to determine whether further calibration of a given channel is necessary, and such analyses are contemplated as falling within the scope of the present invention. If further calibration is desired (YES at step 316), the method 300 returns to step 306, and steps 306–314 are repeated to further reduce sampling mismatch. If no further calibration is deemed necessary (NO at step 316), then the next channel is selected by incrementing the variable N, which represents the channel being evaluated for sampling mismatch.

At step 320, a determination is made whether all the channels in the sample and hold circuit have been calibrated. If not (NO at step 320), the method 300 returns to step 306 and steps 306–316 are performed for the next channel to reduce sampling mismatch. If all the channels have been calibrated (YES at step 320), then the method 300 ends at step 322. Such an ending may be performed, for example, in FIG. 8 by the opening of switch 262, however, other discontinuation sequences may be employed and are contemplated as falling within the scope of the present invention.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Furthermore, to the extent that the term "includes" is used in either the detailed description and the claims, such term is intended to be inclusive in a manner similar to the term "comprising."

What is claimed is:

1. A system for cancelling sampling mismatch in an interleaved sample and hold circuit, comprising:
    a plurality of sample and hold subcircuits coupled in a parallel, time-interleaved fashion between an input and an output;
    a calibration sample and hold subcircuit; and
    a calibration circuit operably coupled to the plurality of sample and hold subcircuits and the calibration sample and hold subcircuit, wherein the calibration circuit is operable to compare an output associated with one of the plurality of sample and hold circuits and an output associated with the calibration sample and hold circuit based on an analog input signal, and modify a hold signal associated with the one or more of the plurality of sample and hold subcircuits based on the comparison, wherein the hold signal is operable to alter a timing of the one or more sample and hold subcircuits.

2. The system of claim 1, wherein the calibration circuit is further operable to selectively compare an output associated with each of the plurality of sample and hold subcircuits with the output of the calibration sample and hold subcircuit, and modify a hold signal associated with each of the plurality of sample and hold subcircuits based on the comparison, wherein the hold signals are operable to alter a timing of the respective sample and hold subcircuits, thereby reducing a sampling mismatch between the plurality of sample and hold circuits.

3. The system of claim 1, wherein the calibration circuit further comprises:
    a signal analysis circuit operable to generate a signal having a state reflecting a phase relationship between a selected one of the sample and hold subcircuits and the calibration sample and hold subcircuit; and
    a delay control circuit operably coupled to the signal analysis circuit, and operable to adjust a delay control signal based on the generated signal of the signal analysis circuit, wherein the delay control signal is employed to modify the hold signal of the selected one of the sample and hold subcircuits.

4. The system of claim 3, wherein the delay control signal comprises a multi-bit word.

5. The system of claim 3, further comprising a slope detection circuit operably coupled to the signal analysis circuit and operable to detect a slope of an analog input signal and provide data associated therewith to the signal analysis circuit for use in generating the signal having a state reflecting the phase relationship between the selected one of the sample and hold subcircuits and the calibration sample and hold subcircuit.

6. A time-interleaved sample and hold circuit calibration system, comprising:
    a plurality of parallel coupled, time-interleaved sample and hold subsystems, wherein each of the subsystems comprise:
        a sample and hold subcircuit operable to sample an input analog signal in accordance with a timing signal associated therewith; and
        an analog to digital converter coupled to the sample and hold subcircuit, and operable to generate digital data as a function of the timing signal of the corresponding sample and hold subcircuit;
    a selectively activatable calibration subcircuit coupled to the plurality of sample and hold subsystems in a parallel coupled, time-interleaved fashion, wherein the calibration subcircuit operates according to one of a plurality of pre-calibrated timing signals, wherein the calibration subcircuit comprises:
        a calibration sample and hold subcircuit operable to sample an analog input signal in accordance with one of the plurality of pre-calibrated timing signal associated therewith; and
        an analog to digital converter coupled to the calibration sample and hold subcircuit, and operable to generate digital data as a function of one of the pre-calibrated timing signals, and wherein each of the pre-calibrated timing signals corresponds to a desired timing of one of the plurality of sample and hold subcircuits, respectively;

a signal analysis circuit operably coupled to the plurality of parallel coupled, time-interleaved sample and hold subsystems and the calibration subcircuit, wherein the signal analysis circuit is operable to compare digital data associated with a selected one of the sample and hold subsystems and the calibration subcircuit operating with a pre-calibrated timing signal which corresponds to the selected sample and hold subsystem for each of the sample and hold subsystems, and generate a delay control signal for modifying the timing of the sample and hold subcircuit within the selected sample and hold subsystems for each of the sample and hold subsystems, thereby reducing a sampling mismatch between the plurality of sample and hold subsystems.

7. The calibration system of claim 6, further comprising a slope detection circuit operably coupled to the signal analysis circuit, and operable to receive the analog input signal, determine a slope thereof, and transmit the slope determination to the signal analysis circuit for analysis thereof.

8. The calibration system of claim 7, wherein the signal analysis circuit is further operable to distinguish a sampling mismatch from other forms of mismatch using the slope determination.

9. The calibration system of claim 7, wherein the signal analysis system is operable to generate an error signal associated with a sampling mismatch between the selected sample and hold subsystem and the calibration subcircuit based on the digital data of the selected sample and hold subsystem and the digital data of the calibration subcircuit and the slope of the analog input signal.

10. The calibration system of claim 7, wherein the slope detection circuit comprises a comparator circuit having a first input coupled to the analog input signal and a second input coupled to the analog input circuit via a delay element, and wherein the comparator provides an output state indicative of whether a magnitude at the first input is greater than a magnitude at the second input, thereby indicating a slope of the analog input signal.

11. The calibration system of claim 6, further comprising a switching circuit operable to couple the analog input signal to the calibration subcircuit in an on-line calibration mode and couple a calibration signal to the calibration subcircuit in an off-line calibration mode, and wherein the calibration subcircuit is operable to generate each of the pre-calibrated timing signals corresponding to the desired timing of the plurality of sample and hold subcircuits in the off-line calibration mode.

12. The calibration system of claim 11, further comprising a switching network associated with the calibration subcircuit, and the signal analysis circuit, wherein the switching network is operable to couple a selected one of the pre-calibration timing signals to the calibration sample and hold subcircuit for sampling the analog input signal in the on-line calibration mode, and further wherein the switching network is operable to selectively couple a selected one of the sample and hold subcircuits to the signal analysis circuit, wherein the selected one of the pre-calibration timing signals correspond to the selected ones of the sample and hold subcircuits.

13. A method of reducing sampling mismatch in a time-interleaved sample and hold circuit, comprising the steps of:

calibrating each of a plurality of time-interleaved sample and hold subcircuits with a calibration sample and hold sub circuit using an analog input signal in response to slope determination; and disengaging the calibration sample and hold subcircuit after the calibrating step.

14. The method of claim 13, wherein the calibrating step comprises:
(a) sampling the analog input signal using a selected one of the sample and hold subcircuits and a timing signal associated therewith;
(b) sampling the analog input signal using the calibration sample and hold subcircuit using a pre-calibrated timing signal associated with the selected one of the sample and hold subcircuits;
(c) analyzing a sample output from the selected one of the sample and hold subcircuits and the calibration sample and hold subcircuit;
(d) adjusting a timing of the timing signal associated with the selected one of the sample and hold subcircuits in response to the analysis; and
(e) repeating steps (a)–(d) for each of the sample and hold subcircuits, wherein the adjusted timing of each of the respective timing signals results in a reduced sampling mismatch between the sample and hold subcircuits.

15. The method of claim 14, further comprising the step of determining a slope of the analog input signal, and using the slope determination in the analyzing step.

16. A method of reducing sampling mismatch in a time-interleaved sample and hold subcircuit, comprising the steps of:
(a) performing an off-line calibration of a calibration sample and hold subcircuit, wherein the off-line calibration comprises identifying a timing associated with a plurality of timing signals for a plurality of sample and hold subcircuits such that if each of a plurality of sample and hold subcircuits are calibrated with respect to a selected one of the plurality of timing signals, the plurality of sample and hold signals will collectively exhibit a reducing in sampling mismatch therebetween;
(b) sampling an analog input using a selected one of the sample and hold subcircuits and a timing signal associated therewith;
(c) sampling the analog input signal using the calibration sample and hold subcircuit using one of the off-line calibrated timing signals associated with the selected one of the sample and hold subcircuits;
(d) identifying a slope of the analog input signal;
(e) analyzing a sample output from the selected one of the sample and hold subcircuits and the calibration sample and hold subcircuit;
(f) adjusting a timing of the timing signal associated with the selected one of the sample and hold subcircuits in response to the slope identification and the sample output analysis; and
(g) repeating steps (b)–(f) for each of the sample and hold subcircuits, wherein the adjusted timing of each of the respective timing signals results in a reduced sampling mismatch between the sample and hold subcircuits.

17. The method of claim 16, further comprising the step of disengaging the off-line calibration of the calibration sample and hold subcircuit prior to step (b).

18. The method of claim 16, wherein the step of identifying a slope of the analog input signal comprises:
comparing the analog input signal with a delayed version of the analog input signal; and
determining the slope based on the comparison.

* * * * *